(12) United States Patent
Lee et al.

(10) Patent No.: US 8,287,301 B2
(45) Date of Patent: Oct. 16, 2012

(54) SOCKET TERMINAL HEAT-DISSIPATING MECHANISM

(75) Inventors: Ming-Tsung Lee, Taoyuan Hsien (TW); Yu-Chi Jen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 92 days.

(21) Appl. No.: 12/957,338

(22) Filed: Nov. 30, 2010

(65) Prior Publication Data
US 2011/0143580 A1    Jun. 16, 2011

(30) Foreign Application Priority Data
Dec. 1, 2009  (TW) .............................. 98141058 A

(51) Int. Cl.
*H01R 13/00*    (2006.01)
(52) U.S. Cl. ........................................ 439/485; 439/535

(58) Field of Classification Search .......... 439/485–487, 439/535, 660
See application file for complete search history.

(56) References Cited

U.S. PATENT DOCUMENTS

| | | | | |
|---|---|---|---|---|
| 7,059,919 B2 * | 6/2006 | Clark et al. | ................... | 439/825 |
| 7,666,025 B2 * | 2/2010 | Cheng et al. | .................. | 439/485 |
| 7,857,656 B2 * | 12/2010 | Tai et al. | ....................... | 439/485 |
| 7,938,675 B1 * | 5/2011 | Yu et al. | ........................ | 439/485 |
| 8,177,579 B2 * | 5/2012 | Tai et al. | ....................... | 439/485 |

* cited by examiner

*Primary Examiner* — Khiem Nguyen

(57) ABSTRACT

A socket terminal heat-dissipating mechanism is provided for use in an electronic device. The electronic device includes a frame and a casing. The socket terminal heat-dissipating mechanism includes a socket and an insulating layer. The socket is mounted in the frame of the electronic device, and includes a contact terminal. The insulating layer is arranged between the contact terminal and the casing of the electronic device, wherein heat energy is conducted from the contact terminal of the socket to the casing through the insulating layer, and passively dissipated away.

7 Claims, 6 Drawing Sheets

SOCKET TERMINAL HEAT-DISSIPATING MECHANISM

CLAIM OF PRIORITY

This application claims priority to Taiwanese Patent Application No. 098141058 filed on Dec. 1, 2009.

FIELD OF THE INVENTION

The present invention relates to a socket terminal heat-dissipating mechanism, and more particularly to a socket terminal heat-dissipating mechanism for use with a power distribution unit.

BACKGROUND OF THE INVENTION

With increasing industrial development, diverse electronic devices are used to achieve various purposes. An electronic device comprises a plurality of electronic components. Generally, different kinds of electronic components are operated by using different voltages.

As known, a power supply apparatus is essential for many electronic devices such as personal computers, industrial computers, servers, communication products or network products. Usually, the user may simply plug a power supply apparatus into an AC wall outlet commonly found in most homes or offices so as to receive an AC voltage. The power supply apparatus will convert the AC voltage into a regulated DC output voltage for powering the electronic device. The regulated DC output voltage is transmitted to the electronic device through a power cable. In addition, a power distribution unit (PDU) is used to distribute electric power among many different electronic devices. During the processes of supplying, converting and distributing electric power, plugs and sockets are important media for transmitting electric power. In other words, plugs and sockets are common components used in the power supply apparatus or the power distribution unit.

According to the internal safety regulation associated with the power distribution unit (PDU), the temperature of the socket of the power distribution unit should be lower than 70° C. With increasing integration of integrated circuits, the number of electronic components included in the power distribution unit is gradually increased and thus the power consumption of the power distribution unit is largely increased. Under this circumstance, the problem associated with heat-dissipation becomes more serious. During operation of the power distribution unit, the heat energy is generated from the electronic components of the power distribution unit and thus the temperature of the power distribution unit is increased. In other words, the temperature of the socket is increased. Although the electronic components of the power distribution unit may withstand 110~150° C., the temperature of the socket should be lower than 70° C. in order to meet the safety regulation. That is, the design of the power distribution unit is restricted by the socket.

Moreover, the power distribution unit comprises plural power supply apparatuses for distributing electric power among many different electronic devices. These power supply apparatuses are connected with corresponding sockets through transmission cables. Since the transmission cables are metallic wires, the heat energy generated from the power supply apparatuses will be partially transmitted to the contact terminals between the transmission cables and the sockets. In addition, when a current is transmitted to the contact terminal of the socket through the metallic wire, heat energy is also generated from the contact impedance. Due to these heat generation sources, the temperature of the contact terminal of the socket is dramatically increased during the electricity transmission process. Since a great amount of heat energy is accumulated on the contact terminal of the socket, the socket is usually overheated and fails to meet the international safety regulation. If no addition heat-dissipating mechanism is used, the output current needs to be reduced in order to prevent from the overheated situation. The reduction of the output current, however, impairs the performance of the power distribution unit.

For solving the overheated problem of the power distribution unit, an active heat-dissipating module (e.g. a fan) is used for inhaling airflow inside the power distribution unit and exhausting the heat beside the socket out of the power distribution unit through the ventilation hole. Recently, the power distribution unit is gradually small-sized and slim. Since the active heat-dissipating module occupies much space of the power distribution unit, the use of the active heat-dissipating module is detrimental to minimization of the power distribution unit. Moreover, the use of the active heat-dissipating module will increase the fabricating cost of the power distribution unit. During operation of the fan, uncomfortable noise is usually generated. Since the operation of the fan consume a portion of electricity of the power distribution unit, the overall performance of the power distribution unit is deteriorated.

There is a need of providing a socket terminal heat-dissipating mechanism so as to obviate the drawbacks encountered from the prior art.

SUMMARY OF THE INVENTION

It is an object of the present invention to provide a socket terminal heat-dissipating mechanism for effectively removing the heat away the socket terminal, thereby increasing the electric safety and reducing the fabricating cost.

In accordance with an aspect of the present invention, there is provided a socket terminal heat-dissipating mechanism for use in an electronic device. The electronic device includes a frame and a casing. The socket terminal heat-dissipating mechanism includes a socket and an insulating layer. The socket is mounted in the frame of the electronic device, and includes a contact terminal. The insulating layer is arranged between the contact terminal and the casing of the electronic device, wherein heat energy is conducted from the contact terminal of the socket to the casing through the insulating layer, and passively dissipated away.

In accordance with another aspect of the present invention, there is provided an electronic device. The electronic device includes a frame, a casing and a socket terminal heat-dissipating mechanism. The frame has a first entrance and a second entrance. The casing is mounted in the second entrance. The socket terminal heat-dissipating mechanism includes a socket and an insulating layer. The socket is mounted in the first entrance of the frame, and includes a contact terminal. The insulating layer is arranged between the contact terminal and the casing, wherein heat energy is conducted from the contact terminal of the socket to the casing through the insulating layer, and passively dissipated away.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
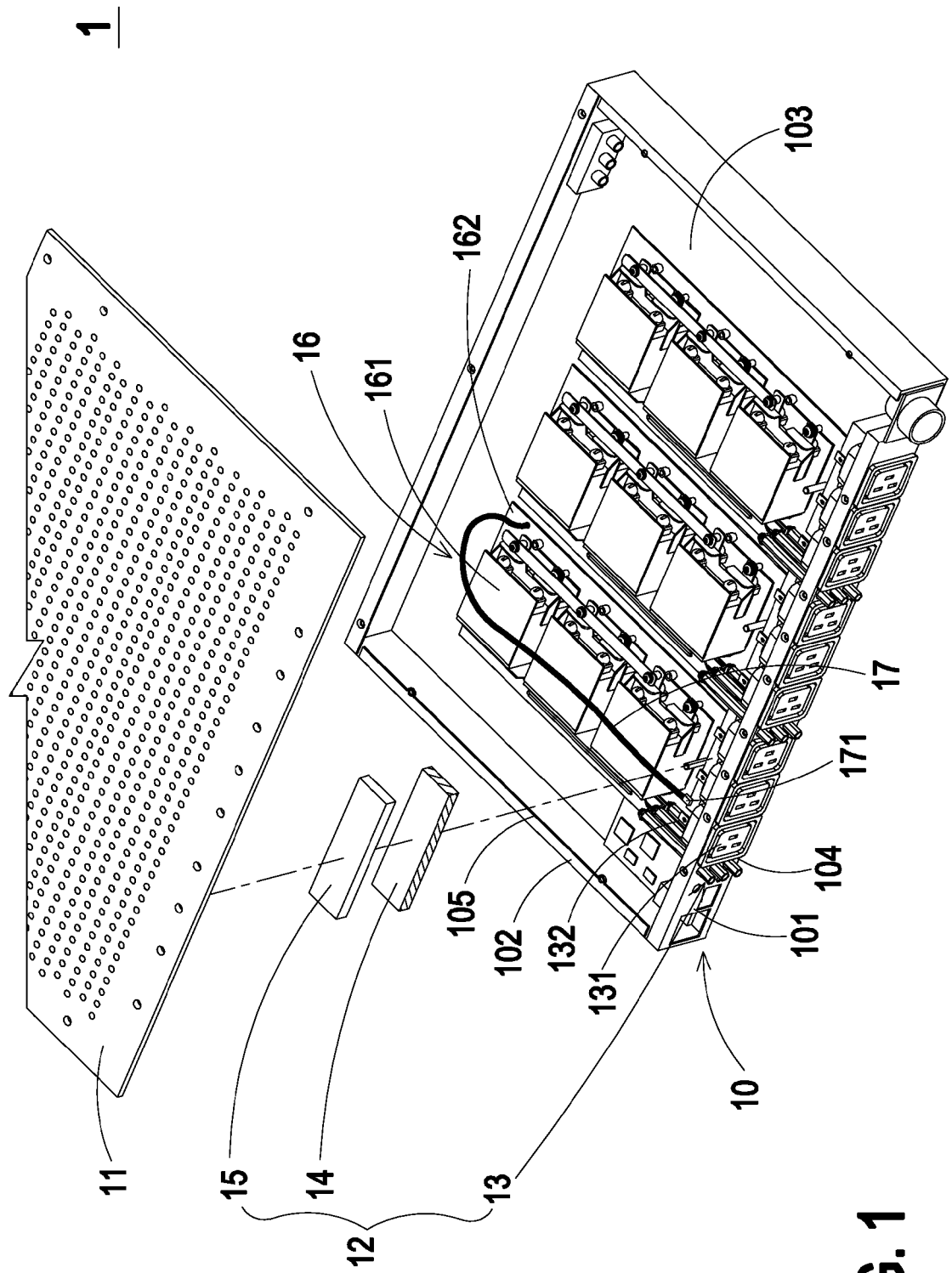
FIG. 1 is a schematic exploded view illustrating an electronic device having a socket terminal heat-dissipating mechanism according to an embodiment of the present invention.

FIG. 1 is a schematic exploded view illustrating an electronic device having a socket terminal heat-dissipating mechanism according to an embodiment of the present invention. As shown in FIG. 1, the electronic device 1 comprises a frame 10, a casing 11 and a socket terminal heat-dissipating mechanism 12. The socket terminal heat-dissipating mechanism 12 comprises at least one socket 13 and an insulating layer 14. In this embodiment, the electronic device 1 is a power distribution unit (PDU). The power distribution unit 1 comprises plural power supply apparatuses 16. Via plural sockets, the power supply apparatuses 16 could provide electricity to external power-receiving devices (not shown) that are plugged in the sockets 13.

The frame 10 is substantially a hollow box. A receptacle 103 is defined by the sidewalls and the bottom of the frame 10. The frame 10 has a first entrance 104 at a first side 101 (e.g. a front side) and a second entrance 105 at a second side 102 (e.g. a top side). The first side 101 and the second side 102 are adjacent to and perpendicular to each other. Electronic components 161 and circuit boards 162 of respective power supply apparatuses 16 are accommodated within the receptacle 103. The sockets 13 are embedded into the first entrance 104 at the first side 101. Each of the sockets 13 has an insertion end 131 and a contact terminal 132. The insertion end 131 is exposed to the first entrance 104 so as to be electrically with an external power-receiving device (not shown). The contact terminal 132 is opposite to the insertion end 131 and accommodated within the receptacle 103. The contact terminal 132 of the socket 13 is connected with a connecting end 171 of a transmission cable 17, so that the sockets 13 is electrically connected to a corresponding power supply apparatus 16 of the power distribution unit.

In this embodiment, the transmission cable 17 comprises a metallic wire core and an insulating shell. The connecting end 171 of the transmission cable 17 is connected to the contact terminal 132 of the sockets 13. The other end of the transmission cable 17 is connected to the circuit board 162 of the power supply apparatus 16. In this embodiment, the connecting end 171 of the transmission cable 17 is sheathed around the contact terminal 132 of the socket 13 such that the socket 13 is electrically connected with the power supply apparatus 16. Optionally, a thermally-conductive layer 15 is arranged between the insulating layer 14 and the casing 11.

Figure 2A:
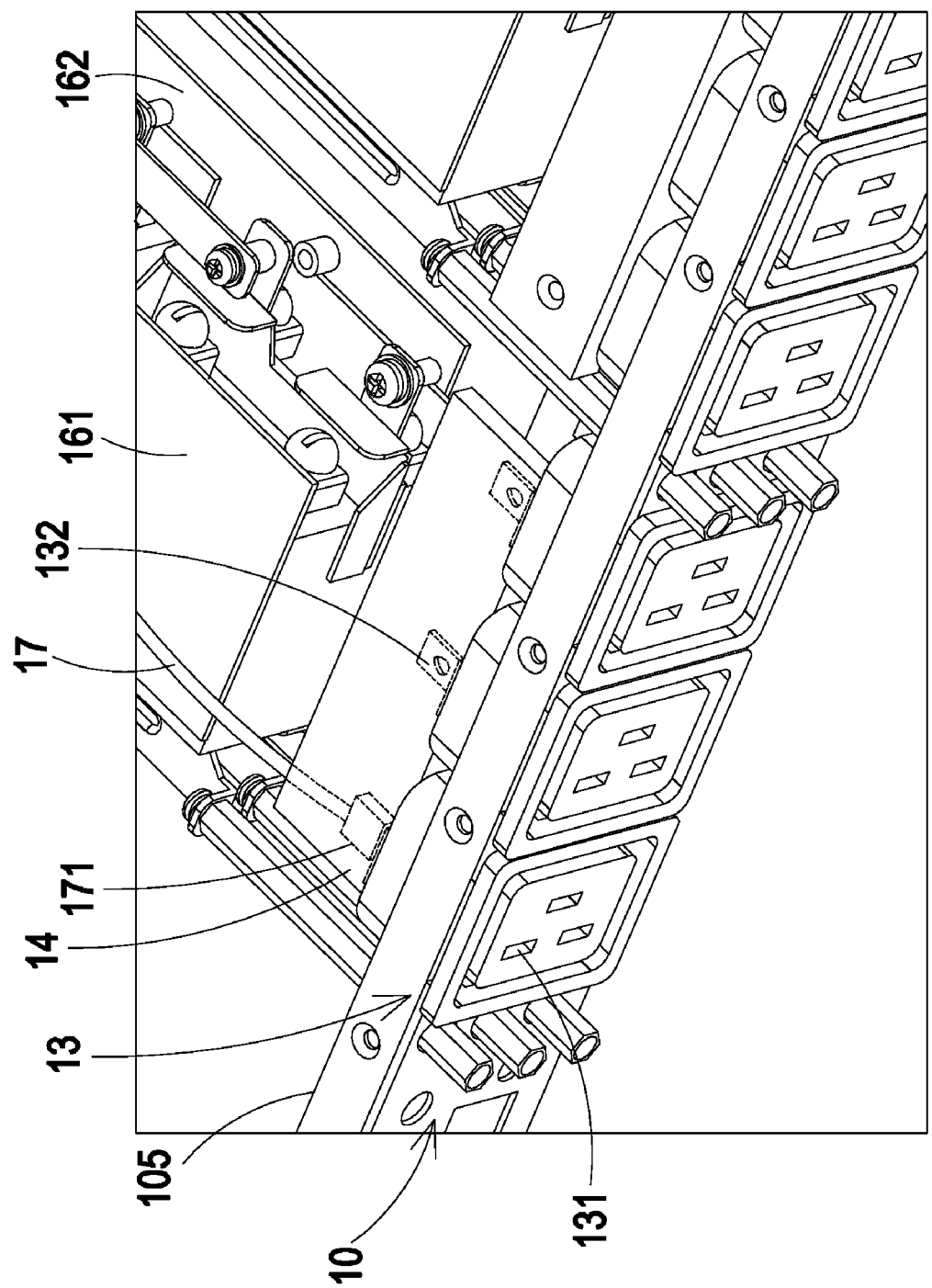
FIGS. 2A, 2B and 2C are schematic partial perspective views illustrating a process of assembling the socket terminal heat-dissipating mechanism of FIG. 1.
Figure 2B:
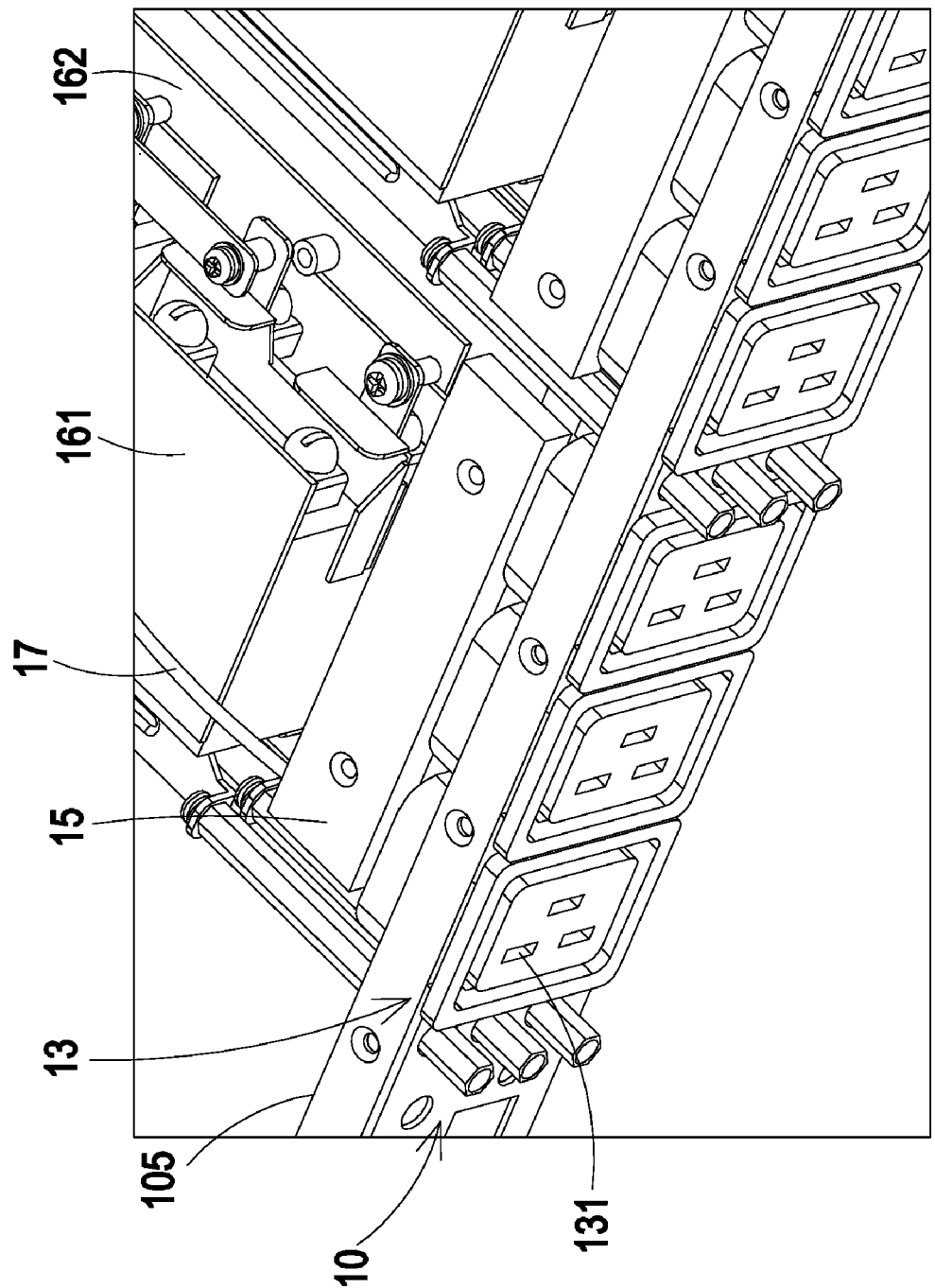
Figure 2C:
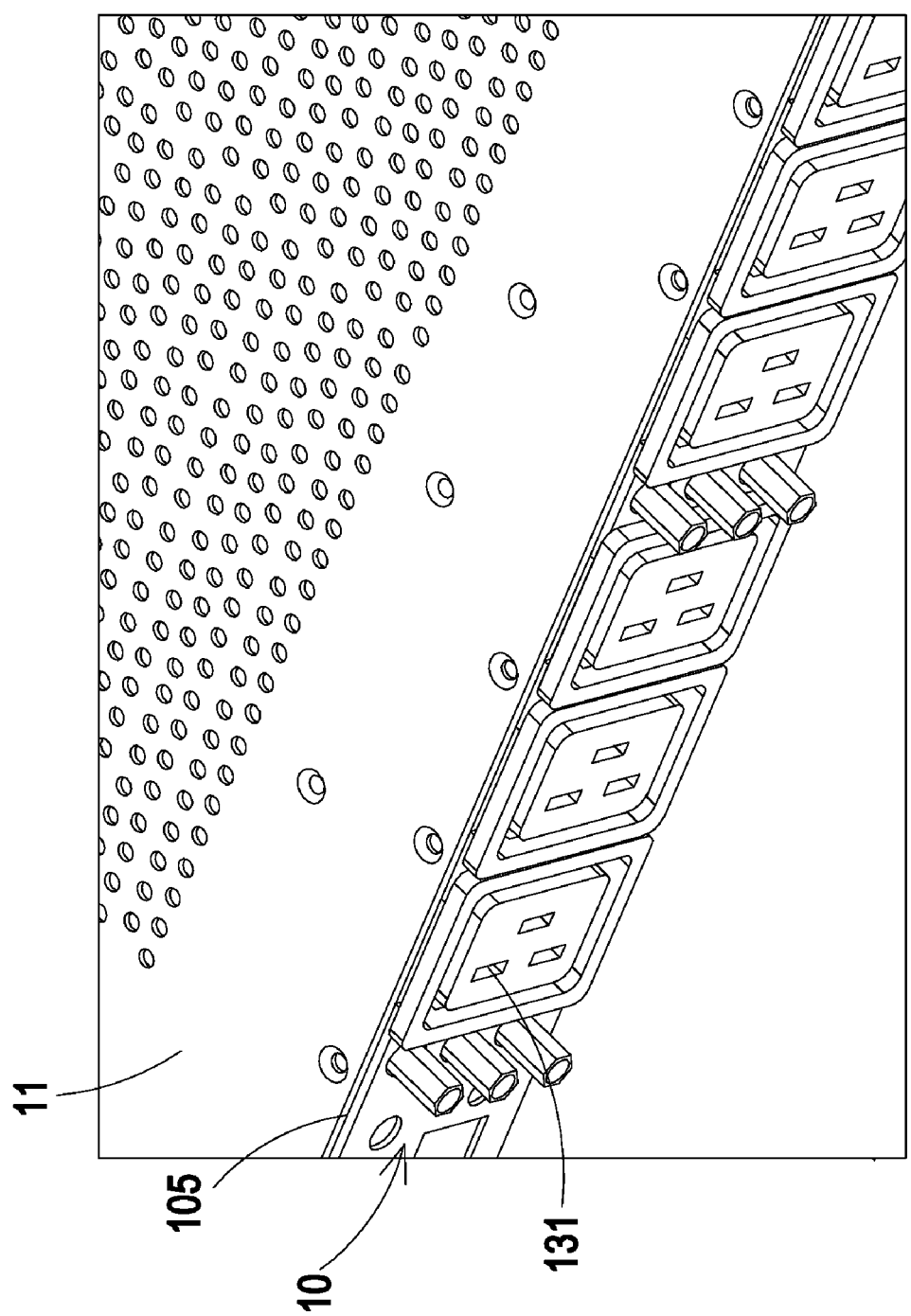

FIGS. 2A, 2B and 2C are schematic partial perspective views illustrating a process of assembling the socket terminal heat-dissipating mechanism of FIG. 1. First of all, the connecting end 171 of the transmission cable 17 is sheathed around the contact terminal 132 of the socket 13 (see FIGS. 1 and 2A). Next, the insulating layer 14 is attached on the connecting end 171 of the transmission cable 17, and the thermally-conductive layer 15 is attached on the insulating layer 14 (see FIGS. 1 and 2B).

It is preferred that the insulating layer 14 is simultaneously disposed over the contact terminals 132 of several sockets 13. The number of the sockets 13 under the insulating layer 14 may be varied as required. The insulating layer 14 is made of thermally-conductive and insulating material in order to conduct heat energy from the contact terminal 132 to the thermally-conductive layer 15. In addition, the insulating layer 14 is also served as an insulating and spacing medium in order to maintain electric safety. The insulating layer 14 has a flat surface or a flexible surface, so that the thermally-conductive layer 15 could be closely attached on the insulating layer 14 to increase the heat-conducting efficacy.

The insulating layer 14 used in the present invention is made of polyimide, polyester, Kapton (polyimide under a registered trademark of DuPont), aluminum, aluminum hydroxide, boron nitride, or a combination thereof, but it is not limited thereto.

In some embodiments, the insulating layer 14 is liquid glue such as a thermosetting and thermally-conductive plastic binder. The insulating layer 14 is firstly adhered on the contact terminal 132 of the socket 13 by an automatic tool, and then the thermally-conductive layer 15 is fixed on the insulating layer 14 upon heating the insulating layer 14. In this embodiment, the thermally-conductive layer 15 is made of high thermally conductive material such as a metallic material or a ceramic material. An example of the metallic material includes but is not limited to aluminum or copper. An example of the ceramic material includes but is not limited to aluminum oxide.

Please refer to FIGS. 2B and 2C. In some embodiments, the insulating layer 14 is arranged between the contact terminal 132 of the socket 13 and the casing 11. As such, the heat energy could be quickly conducted from the contact terminal 132 of the socket 13 to the casing 11 of the electronic device through the insulating layer 14 and passively dissipated away. In some embodiments, the thermally-conductive layer 15 is arranged between the insulating layer 14 and the casing 11. The thermally-conductive layer 15 has a higher thermal conductivity than the insulating layer 14. After the insulating layer 14 is disposed over the contact terminal 132 of the socket 13, the thermally-conductive layer 15 is attached on the flat or flexible surface of the insulating layer 14 (see FIG. 2B). The thermally-conductive layer 15 is made of a high thermally conductive material such as metallic material (aluminum or copper) or a ceramic material (e.g. aluminum oxide). Next, the casing 11 is placed in the second entrance 105 at the second side 102 of the frame 10 such that the casing 11 is closely contacted with the thermally-conductive layer 15. As such, the heat energy could be transmitted from the thermally-conductive layer 15 to the casing 11. In this embodiment, the casing 11 is made of a metallic material such as aluminum.

Figure 3A:
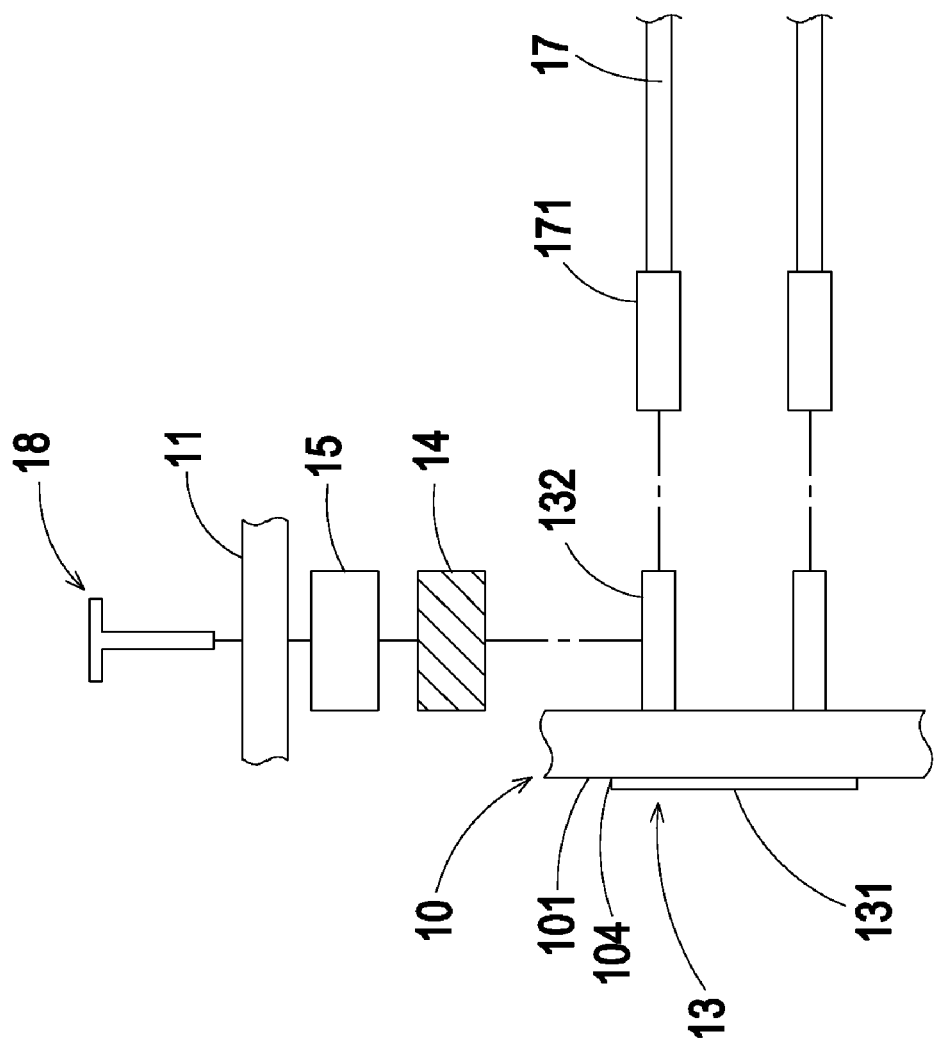
FIGS. 3A and 3B are schematic cross-sectional views illustrating a process of assembling the socket terminal heat-dissipating mechanism of FIG. 1.
Figure 3B:
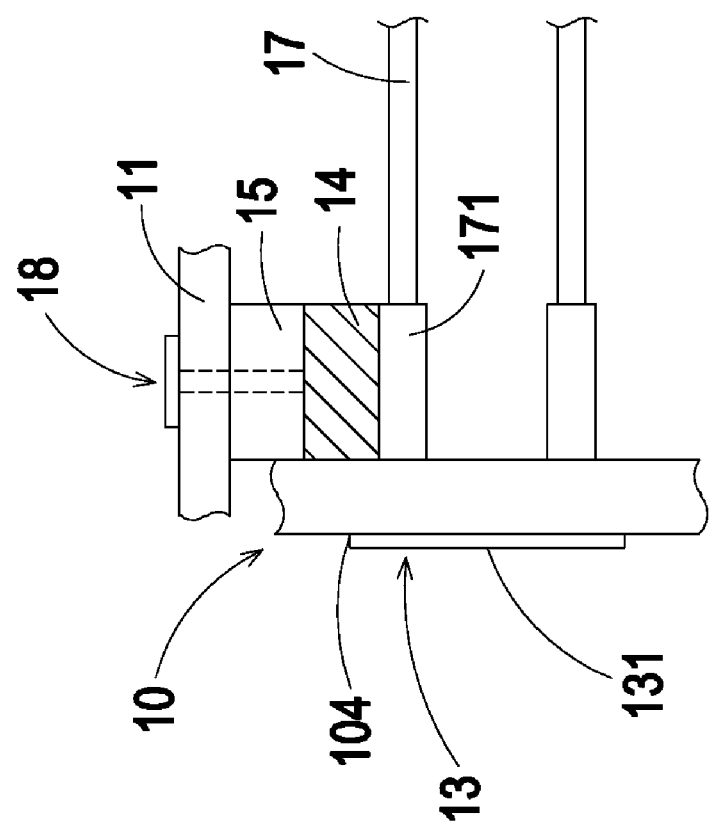

FIGS. 3A and 3B are schematic cross-sectional views illustrating a process of assembling the socket terminal heat-dissipating mechanism of FIG. 1. As shown in FIGS. 3A and 3B, the socket 13 is embedded into the first entrance 104 of the frame 10. The insertion end 131 of the socket 13 is exposed to the first entrance 104 so as to be electrically with an external power-receiving device (not shown). The contact terminal 132 is opposite to the insertion end 131 and accommodated within the receptacle 103 of the frame 10. The connecting end 171 of the transmission cable 17 is sheathed around the contact terminal 132 of the socket 13. Next, the insulating layer 14, the thermally-conductive layer 15 and the casing 11 are successively disposed over the connecting end 171 of the transmission cable 17 (or the contact terminal 132 of the socket 13). By penetrating a fasting element 18 through the casing 11 and the thermally-conductive layer 15, the casing 11 is fixed on the thermally-conductive layer 15. An example of the fasting element 18 includes but is not limited to a screw. Meanwhile, the socket terminal heat-dissipating mechanism 12 is combined with the power distribution unit 1.

Due to the multi-layered thermally-conductive structure collectively defined by the insulating layer 14 and the thermally-conductive layer 15, the heat energy could be quickly conducted from the contact terminal 132 of the socket 13 to the casing 11. After the heat energy is conducted to the casing 11, the hear energy will be quickly radiated to the ambient air by nature convection and radiation because of the large area of the casing. In other words, the socket terminal heat-dissipating mechanism 12 is capable of passively dissipating heat energy away without the need of an additional active heat-dissipating module. Since no active heat-dissipating module is required, the overall volume of the electronic device 1 could be reduced. Under this circumstance, the electronic device 1 could be made small-sized and slim.

From the above description, the socket terminal heat-dissipating mechanism of the present invention comprises a socket, an insulating layer and a thermally-conductive layer. By successively placing insulating layer, the thermally-conductive layer and the casing over the contact terminal of the socket, the heat energy could be quickly conducted from the contact terminal of the socket to the casing and then radiated to the ambient air by means of the large are of the casing. Since the socket terminal heat-dissipating mechanism of the present invention is effective for passively dissipating heat energy away, the heat energy accumulated at the contact terminal of the socket is minimized. By using the socket terminal heat-dissipating mechanism of the present invention, the air temperature beside the socket is largely reduced to meet the international safety regulation. In addition, since no active heat-dissipating module is used, the socket terminal heat-dissipating mechanism of the present invention is very cost-effective.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A socket terminal heat-dissipating mechanism for use in an electronic device, said electronic device comprising a frame and a casing, said socket terminal heat-dissipating mechanism comprising:
   a socket mounted in said frame of said electronic device, and comprising at least one contact terminal; and
   an insulating layer arranged between said contact terminal and said casing of said electronic device, wherein heat energy is conducted from said contact terminal of said socket to said casing through said insulating layer, and passively dissipated away.

2. The socket terminal heat-dissipating mechanism according to claim 1 further comprising a thermally-conductive layer, which is arranged between said insulating layer and said casing, wherein heat energy is conducted from said insulating layer to said casing through said thermally-conductive layer.

3. The socket terminal heat-dissipating mechanism according to claim 2 wherein said insulating layer has a flat or flexible surface, so that said thermally-conductive layer is closely attached on said insulating layer.

4. The socket terminal heat-dissipating mechanism according to claim 2 wherein said thermally-conductive layer has a higher thermal conductivity than said insulating layer.

5. The socket terminal heat-dissipating mechanism according to claim 2 wherein said thermally-conductive layer is made of a higher thermally conductive material, which includes a metallic material or a ceramic material.

6. The socket terminal heat-dissipating mechanism according to claim 1 wherein said contact terminal of said socket is connected with a connecting end of a transmission cable.

7. The socket terminal heat-dissipating mechanism according to claim 1 wherein said electronic device is a power distribution unit.

* * * * *